United States Patent
Sumida et al.

(10) Patent No.: US 10,985,018 B2
(45) Date of Patent: Apr. 20, 2021

(54) GROUP III NITRIDE SEMICONDUCTOR SUBSTRATE AND METHOD FOR MANUFACTURING GROUP III NITRIDE SEMICONDUCTOR SUBSTRATE

(71) Applicant: FURUKAWA CO., LTD., Tokyo (JP)

(72) Inventors: Yasunobu Sumida, Tokyo (JP); Yasuharu Fujiyama, Tochigi (JP)

(73) Assignee: FURUKAWA CO., LTD., Tokyo (JP)

( * ) Notice: Subject to any disclaimer, the term of this patent is extended or adjusted under 35 U.S.C. 154(b) by 6 days.

(21) Appl. No.: 16/476,506

(22) PCT Filed: Dec. 25, 2017

(86) PCT No.: PCT/JP2017/046460
§ 371 (c)(1),
(2) Date: Jul. 8, 2019

(87) PCT Pub. No.: WO2018/131455
PCT Pub. Date: Jul. 19, 2018

(65) Prior Publication Data
US 2020/0058490 A1 Feb. 20, 2020

(30) Foreign Application Priority Data
Jan. 10, 2017 (JP) ................................. 2017-001758

(51) Int. Cl.
*H01L 21/3205* (2006.01)
*H01L 23/48* (2006.01)
(Continued)

(52) U.S. Cl.
CPC ...... *H01L 21/0254* (2013.01); *H01L 21/0242* (2013.01); *H01L 21/02433* (2013.01);
(Continued)

(58) Field of Classification Search
CPC .................... H01L 21/02433; H01L 21/02458
(Continued)

(56) References Cited

U.S. PATENT DOCUMENTS

| 7,435,608 B2 | 10/2008 | Shibata |
| 7,771,532 B2 | 8/2010 | Uematsu |

(Continued)

FOREIGN PATENT DOCUMENTS

| JP | 2005343713 A | 12/2005 |
| JP | 2007254258 A | 10/2007 |

(Continued)

OTHER PUBLICATIONS

International Search Report dated Mar. 20, 2018 filed in PCT/JP2017/046460.
(Continued)

*Primary Examiner* — Calvin Lee
(74) *Attorney, Agent, or Firm* — Rankin, Hill & Clark LLP

(57) ABSTRACT

A method for manufacturing a group III nitride semiconductor substrate includes a sapphire substrate preparation step S10 for preparing a sapphire substrate having, as a main surface, a {10-10} plane or a plane obtained by inclining the {10-10} plane at a predetermined angle in a predetermined direction; a heat treatment step S20 for performing a heat treatment over the sapphire substrate while performing a nitriding treatment or without performing the nitriding treatment; a buffer layer forming step S30 for forming a buffer layer over the main surface of the sapphire substrate after the heat treatment; and a growth step S40 for forming a group III nitride semiconductor layer, in which a growth surface has a predetermined plane orientation, over the buffer layer, in which at least one of a plane orientation of the main surface of the sapphire substrate, presence or absence of the
(Continued)

nitriding treatment during the heat treatment, and a growth temperature in the buffer layer forming step is adjusted such that the growth surface of the group III nitride semiconductor layer has the predetermined plane orientation.

14 Claims, 3 Drawing Sheets

(51) Int. Cl.
  *H01L 21/02* (2006.01)
  *H01L 29/20* (2006.01)
(52) U.S. Cl.
  CPC .. *H01L 21/02458* (2013.01); *H01L 21/02658* (2013.01); *H01L 29/2003* (2013.01)
(58) Field of Classification Search
  USPC ......... 257/615, 745; 438/604, 660, 686, 794
  See application file for complete search history.

(56) References Cited

U.S. PATENT DOCUMENTS

| | | | |
|---|---|---|---|
| 7,772,585 B2 | 8/2010 | Uematsu | |
| 8,709,843 B2 | 4/2014 | Shakuda | |
| 10,260,146 B2 * | 4/2019 | Miyake | ............ H01L 21/02172 |
| 10,301,743 B2 * | 5/2019 | Fujisawa | ................ C30B 25/18 |
| 2005/0274976 A1 | 12/2005 | Shibata | |
| 2006/0272572 A1 | 12/2006 | Uematsu | |
| 2007/0040219 A1 | 2/2007 | Shibata | |
| 2009/0155989 A1 | 6/2009 | Uematsu | |
| 2009/0269867 A1 | 10/2009 | Shakuda | |
| 2010/0155778 A1 | 6/2010 | Sato et al. | |
| 2013/0126900 A1 | 5/2013 | Inoue | |

FOREIGN PATENT DOCUMENTS

| | | |
|---|---|---|
| JP | 2008078613 A | 4/2008 |
| JP | 2011042542 A | 3/2011 |
| JP | 2012160755 A | 8/2012 |
| JP | 2014172797 A | 9/2014 |
| JP | 2014196230 A | 10/2014 |

OTHER PUBLICATIONS

Partial Supplementary European Search Report dated Sep. 21, 2020 issued in the corresponding European Patent Application No. 17891174.9.

* cited by examiner

GROUP III NITRIDE SEMICONDUCTOR SUBSTRATE AND METHOD FOR MANUFACTURING GROUP III NITRIDE SEMICONDUCTOR SUBSTRATE

TECHNICAL FIELD

The present invention relates to a group III nitride semiconductor substrate and a method for manufacturing a group III nitride semiconductor substrate.

BACKGROUND ART

Related techniques are disclosed in Patent Document 1. As disclosed in Patent Document 1, in a case where a device (for example, an optical device, an electronic device, or the like) is formed on the c-plane of a group III nitride semiconductor crystal, the internal quantum efficiency is reduced due to a piezoelectric field. Therefore, attempts are being made to form devices on so-called semipolar planes (planes different from polar planes and non-polar planes).

RELATED DOCUMENT

Patent Document

[Patent Document 1] Japanese Patent Application Publication No. 2012-160755

SUMMARY OF THE INVENTION

Technical Problem

When forming a device on a semipolar plane, it is possible to increase the internal quantum efficiency in comparison with forming a device on a c-plane. An object of the present invention is to provide a new technique for epitaxially growing a group III nitride semiconductor with a desired semipolar plane as a growth surface.

Solution to Problem

According to the present invention, there is provided a method for manufacturing a group III nitride semiconductor substrate, the method including a sapphire substrate preparation step for preparing a sapphire substrate having, as a main surface, a {10-10} plane or a plane obtained by inclining the {10-10} plane at a predetermined angle in a predetermined direction; a heat treatment step for performing a heat treatment on the sapphire substrate while performing a nitriding treatment or without performing the nitriding treatment; a buffer layer forming step for forming a buffer layer over the main surface of the sapphire substrate after the heat treatment; and a growth step for forming a group III nitride semiconductor layer, in which a growth surface has a predetermined plane orientation, over the buffer layer, in which at least one of a plane orientation of the main surface of the sapphire substrate, presence or absence of the nitriding treatment during the heat treatment, and a growth temperature in the buffer layer forming step is adjusted such that the growth surface of the group III nitride semiconductor layer has the predetermined plane orientation.

In addition, according to the present invention, there is provided a method for manufacturing a group III nitride semiconductor substrate, the method including a sapphire substrate preparation step for preparing a sapphire substrate having, as a main surface, a {10-10} plane or a plane obtained by inclining the {10-10} plane at a predetermined angle in a predetermined direction; a heat treatment step for performing a heat treatment on the sapphire substrate at a temperature of 1060° C. or higher and 1120° C. or lower while performing a nitriding treatment or without performing the nitriding treatment; a buffer layer forming step for forming a buffer layer at a growth temperature of 800° C. or higher and 1125° C. or lower over the main surface of the sapphire substrate after the heat treatment; and a growth step for forming a group III nitride semiconductor layer over the buffer layer.

In addition, according to the present invention, there is provided a group III nitride semiconductor substrate including a group III nitride semiconductor layer formed of a group III nitride semiconductor crystal, in which a plane orientation of a growth surface is either a {10-15} plane or a plane obtained by inclining the {10-15} plane at any angle of greater than 0° and 0.5° or less.

Advantageous Effects of Invention

According to the present invention, a new technique is realized for epitaxially growing a group III nitride semiconductor with a desired semipolar plane as a growth surface.

BRIEF DESCRIPTION OF THE DRAWINGS

The objects described above, other objects, characteristics, and advantages will be made clearer from the preferable embodiments and associated drawings described below.

DESCRIPTION OF EMBODIMENTS

A description will be given below of embodiments of a group III nitride semiconductor substrate and a method for manufacturing a group III nitride semiconductor substrate of the present invention using the drawings. The drawings are merely schematic views for illustrating the configuration of the invention, and the size, shape, and number of each member, the ratios of sizes of different members, and the like are not limited to the illustrated examples.

First Embodiment

Figure 1:
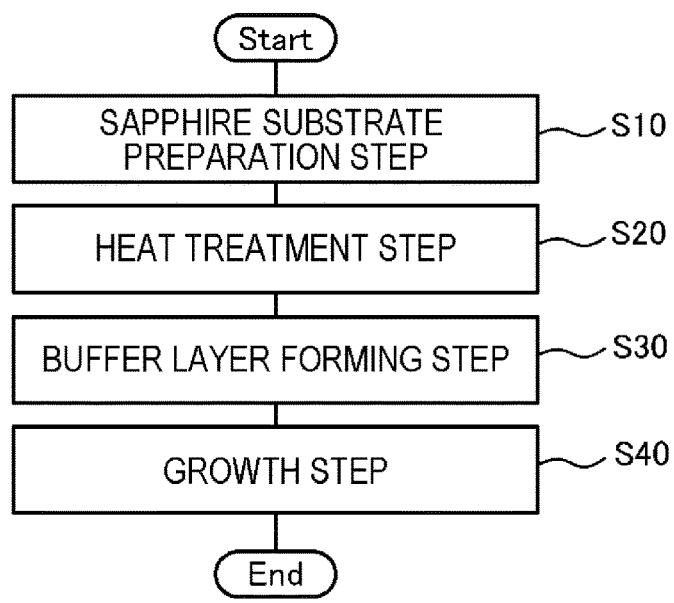
FIG. 1 is a flowchart showing an example of a processing flow of a method for manufacturing a group III nitride semiconductor substrate of the present embodiment.

First, a description will be given of an example of a method for manufacturing a group III nitride semiconductor substrate of the present embodiment. FIG. 1 is a flowchart showing an example of a processing flow of a method for manufacturing a group III nitride semiconductor substrate of the present embodiment. As illustrated, the method for manufacturing a group III nitride semiconductor substrate of the present embodiment has a sapphire substrate preparation step S10, a heat treatment step S20, a buffer layer forming step S30, and a growth step S40.

Figure 2A:
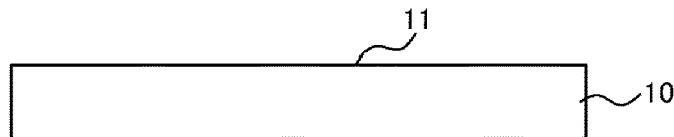
FIG. 2 is a step diagram showing an example of a processing flow of the method for manufacturing a group III nitride semiconductor substrate of the present embodiment.
Figure 2B:
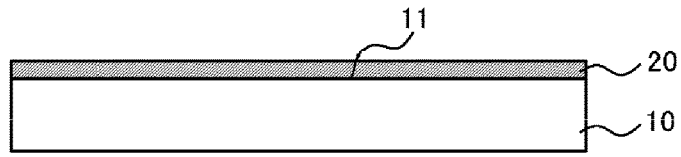
Figure 2C:
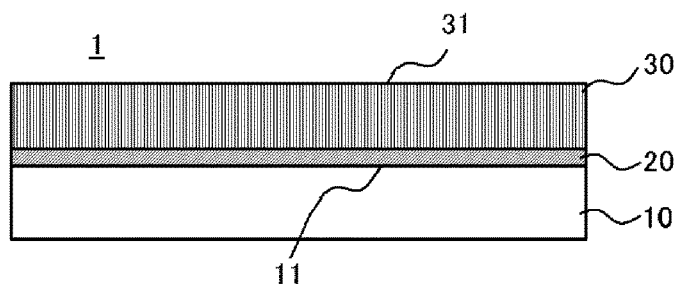

In the sapphire substrate preparation step S10, a sapphire substrate having, as a main surface, a {10-10} plane or a plane obtained by inclining the {10-10} plane at a predetermined angle in a predetermined direction is prepared. FIG. 2(1) shows an example of a schematic side surface view of a sapphire substrate 10 prepared in the above step. The diameter of the sapphire substrate 10 is, for example, 1 inch or more. In addition, the thickness of the sapphire substrate 10 is, for example, 300 µm or more.

The main surface 11 is a {10-10} plane or a plane obtained by inclining the {10-10} plane at a predetermined angle in a predetermined direction.

The plane obtained by inclining the {10-10} plane at a predetermined angle in a predetermined direction may be, for example, a plane obtained by inclining the {10-10} plane at any angle greater than 0° and 0.5° or less in an arbitrary direction.

In addition, the plane obtained by inclining the {10-10} plane at a predetermined angle in a predetermined direction may be a plane obtained by inclining the {10-10} plane at any angle of greater than 0° and 30° or less in a direction in which the {10-10} plane is parallel with an a-plane. Alternatively, the plane obtained by inclining the {10-10} plane at a predetermined angle in a predetermined direction may be a plane obtained by inclining the {10-10} plane at any angle of greater than 12.5° and 22.5° or less in the direction in which the {10-10} plane is parallel with the a-plane. For example, the plane obtained by inclining the {10-10} plane at a predetermined angle in a predetermined direction may be a plane obtained by inclining the {10-10} plane at any angle of 1.5° or more and 2.5° or less, 4.5° or more and 5.5° or less, 9.5° or more and 10.5° or less, 14.5° or more and 15.5° or less, or 19.5° or more and 20.5° or less in the direction in which the {10-10} plane is parallel with the a-plane.

In addition, the plane obtained by inclining the {10-10} plane at a predetermined angle in a predetermined direction may be a plane obtained by inclining the {10-10} plane at any angle of greater than 0° and 60° or less in a direction in which the {10-10} plane is parallel with a c-plane. Alternatively, the plane obtained by inclining the {10-10} plane at a predetermined angle in a predetermined direction may be a plane obtained by inclining the {10-10} plane at any angle of greater than 12.5° and 22.5° or less in the direction in which the {10-10} plane is parallel with the c-plane. For example, the plane obtained by inclining the {10-10} plane at a predetermined angle in a predetermined direction may be a plane obtained by inclining the {10-10} plane at any angle of 1.5° or more and 2.5° or less, 4.5° or more and 5.5° or less, 9.5° or more and 10.5° or less, 14.5° or more and 15.5° or less, or 19.5° or more and 20.5° or less in the direction in which the {10-10} plane is parallel with the c-plane.

In addition, the plane obtained by inclining the {10-10} plane at a predetermined angle in a predetermined direction may be a plane obtained by inclining the {10-10} plane at any angle illustrated above in both of the direction in which the {10-10} plane is parallel with the c-plane and the direction in which the {10-10} plane is parallel with the a-plane.

In addition, the plane obtained by inclining the {10-10} plane at a predetermined angle in a predetermined direction may be a plane obtained by inclining the {10-10} plane at any angle of 9.5° or more and 10.5° or less, 14.5° or more and 15.5° or less, and 19.5° or more and 20.5° or less in the direction in which the {10-10} plane is parallel with the first surface. The first surface is a surface in which the c-plane is inclined at 44.5° or more and 45.5° or less in the direction in which the c-plane is parallel with the a-plane.

In addition, the plane obtained by inclining the {10-10} plane at a predetermined angle in a predetermined direction may be a plane obtained by inclining the {10-10} plane at any angle of 29.5° or more and 30.5° or less in the direction in which the {10-10} plane is parallel with the a-plane and further inclining at any angle of 27.5° or more and 30.5° or less in the direction in which the {10-10} plane is parallel with the c-plane.

The plane orientation of the main surface 11 of the sapphire substrate 10 is one factor (the first factor) for adjusting the plane orientation of the growth surface of the group III nitride semiconductor layer epitaxially grown thereon. That is, adjusting the plane orientation of the main surface 11 of the sapphire substrate 10 makes it possible to adjust the plane orientation of the growth surface of the group III nitride semiconductor layer epitaxially grown thereon.

In addition, the plane orientation of the main surface 11 of the sapphire substrate 10 is also a factor for adjusting the surface state of the growth surface of the group III nitride semiconductor layer epitaxially grown thereon. That is, adjusting the plane orientation of the main surface 11 of the sapphire substrate 10 makes it possible to adjust the surface state of the growth surface of the group III nitride semiconductor layer epitaxially grown thereon.

A description will be given below of the relationship between the first factor and the plane orientation and surface state of the growth surface of the group III nitride semiconductor layer.

Returning to FIG. 1, in the heat treatment step S20, a heat treatment is performed on the sapphire substrate 10 while performing the nitriding treatment or without performing the nitriding treatment. The conditions of the heat treatment are as follows.

Temperature: 800° C. or higher and 1120° C. or lower
Pressure: 50 torr to 250 torr
Heat treatment time: 10 to 15 minutes
Carrier gas: $H_2$, $N_2$
$H_2$ (carrier gas) supply rate: 3.0 slm or more and 12.0 slm or less
$N_2$ (carrier gas) supply rate: 1.0 slm or more and 4.5 slm or less In a case where the heat treatment is performed while performing the nitriding treatment, $NH_3$ is supplied at 30 slm or less during the heat treatment.

In a case where the heat treatment is performed without performing the nitriding treatment, $NH_3$ is not supplied during the heat treatment.

The presence or absence of the nitriding treatment during the heat treatment under the above conditions may be one factor (the second factor) for adjusting the plane orientation of the growth surface of the group III nitride semiconductor layer epitaxially grown on the sapphire substrate 10. That is, adjusting the presence or absence of the nitriding treatment during the heat treatment under the above conditions may make it possible to adjust the plane orientation of the growth surface of the group III nitride semiconductor layer epitaxially grown on the sapphire substrate 10.

In addition, the presence or absence of the nitriding treatment during the heat treatment under the above conditions may be a factor for adjusting the surface state of the growth surface of the group III nitride semiconductor layer epitaxially grown on the sapphire substrate 10. That is, adjusting the presence or absence of the nitriding treatment during the heat treatment under the above conditions may make it possible to adjust the surface state of the growth surface of the group III nitride semiconductor layer epitaxially grown thereon.

A description will be given below of the relationship between the second factor and the plane orientation and surface state of the growth surface of the group III nitride semiconductor layer.

Returning to FIG. 1, in the buffer layer forming step S30, as shown in FIG. 2(2), the buffer layer 20 is formed on the main surface 11 of the sapphire substrate 10 after the heat treatment. The thickness of the buffer layer 20 to be formed is, for example, 50 nm or more and 300 nm or less.

The buffer layer 20 is, for example, an AlN layer. For example, the buffer layer 20 may be formed by epitaxially growing an AlN crystal under the following conditions.

Growth method: MOCVD method
Growth temperature: 800° C. or higher and 1125° C. or lower
Pressure: 90 torr or more to 110 torr or less
V/III ratio: 3000 or more and 6000 or less
TMAl supply rate: 40 ccm or more and 100 ccm or less
$NH_3$ supply rate: 1 slm or more and 10 slm or less
Carrier gas: $H_2$
$H_2$ (carrier gas) supply rate: 3.0 slm or more and 12.0 slm or less The growth temperature when forming the buffer layer 20 under the above conditions may be one factor (the third factor) for adjusting the plane orientation of the growth surface of the group III nitride semiconductor layer epitaxially grown on the sapphire substrate 10. That is, adjusting the growth temperature when forming the buffer layer 20 under the above conditions may make it possible to adjust the plane orientation of the growth surface of the group III nitride semiconductor layer epitaxially grown on the sapphire substrate 10.

Further, the growth temperature when forming the buffer layer 20 under the above conditions may be a factor for adjusting the surface state of the growth surface of the group III nitride semiconductor layer epitaxially grown on the sapphire substrate 10. That is, adjusting the growth temperature at the time of forming the buffer layer 20 under the above conditions may make it possible to adjust the surface state of the growth surface of the group III nitride semiconductor layer epitaxially grown thereon.

A description will be given below of the relationship between the third factor and the plane orientation and surface state of the growth surface of the group III nitride semiconductor layer.

Returning to FIG. 1, in the growth step S40, a group III nitride semiconductor crystal (example: GaN crystal) is epitaxially grown on the buffer layer 20 under the following growth conditions and a group III nitride semiconductor layer 30 in which the growth surface 31 is in a predetermined plane orientation is formed, as shown in FIG. 2(3). The thickness of the group III nitride semiconductor layer 30 is, for example, 1 μm or more and 20 μm or less.

In a case of the present embodiment in which a group III nitride semiconductor crystal is epitaxially grown on the buffer layer 20 under the following growth conditions, it is possible to adjust the plane orientation of the growth surface 31 using the first to third factors described above. In addition, it is also possible to adjust the surface state of the growth surface 31 using the first to third factors described above. A description will be given below of the relationship between the first to third factors and the plane orientation and surface state of the growth surface 31 of the group III nitride semiconductor layer 30.

Growth method: MOCVD (Metal Organic Chemical Vapor Deposition) method
Growth temperature: 950° C. or higher and 1110° C. or lower
Pressure: 100 torr or more and 500 torr or less
V/III ratio: 500 or more and 2000 or less
TMGa supply rate: 200 ccm or more and 750 ccm or less
$NH_3$ supply rate: 2 slm or more and 25 slm or less
Carrier gas: $H_2$, $N_2$
$H_2$ (carrier gas) supply rate: 13.0 slm or more and 14.0 slm or less
$N_2$ (carrier gas) supply rate: 1.0 slm or more and 2.0 slm or less As described above, it is possible to manufacture the group III nitride semiconductor substrate 1 having the sapphire substrate 10, the buffer layer 20, and the group III nitride semiconductor layer 30 as shown in FIG. 2(3). In the case of the illustrated example, the growth surface 31 of the group III nitride semiconductor layer 30 is apart of the surface (exposed surface) of the group III nitride semiconductor substrate 1.

Figure 3:
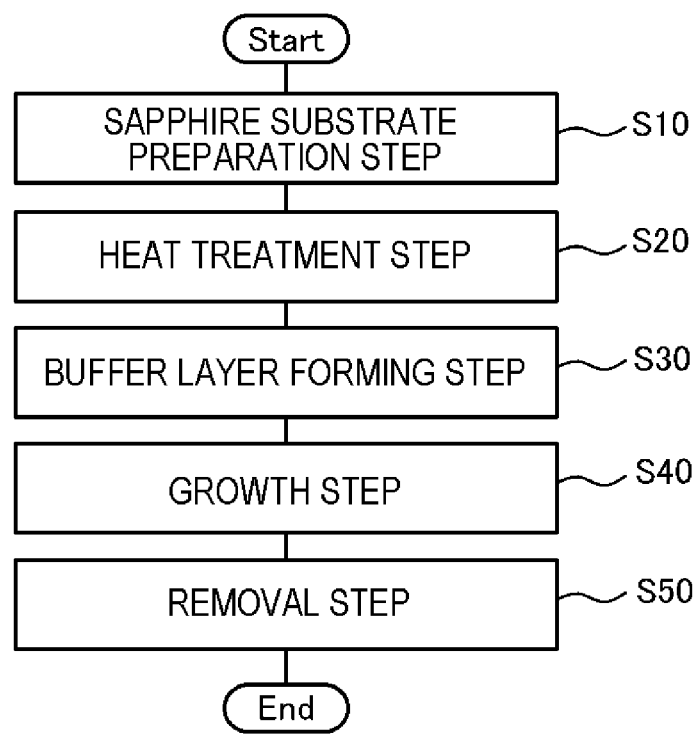
FIG. 3 is a flowchart showing an example of a processing flow of the method for manufacturing a group III nitride semiconductor substrate of the present embodiment.

As shown in FIG. 3, the method for manufacturing a group III nitride semiconductor substrate of the present embodiment may have a removal step S50 in addition to the sapphire substrate preparation step S10, the heat treatment step S20, the buffer layer forming step S30, and the growth step S40.

Figure 4:
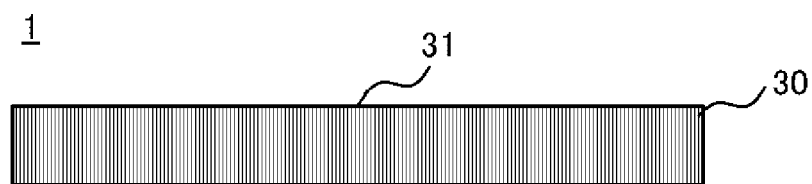
FIG. 4 is a schematic side surface view showing an example of the group III nitride semiconductor substrate of the present embodiment.

In the removal step S50, the sapphire substrate 10 is removed after the growth step S40. For example, the sapphire substrate 10 is removed from the laminate of FIG. 2(3) by polishing, slicing, or the like. In the removal step S50, the buffer layer 20 may be further removed. As a result, the group III nitride semiconductor substrate 1 formed of the group III nitride semiconductor layer 30 as shown in FIG. 4 is obtained. In the case of the illustrated example, the growth surface 31 of the group III nitride semiconductor layer 30 is apart of the surface (exposed surface) of the group III nitride semiconductor substrate 1.

The group III nitride semiconductor substrate 1 of the present embodiment may be used as a substrate for forming devices such as electronic devices and optical devices on the group III nitride semiconductor layer 30. In addition, a plurality of substrates may be obtained by cutting out parts from the group III nitride semiconductor layer 30 by slicing or the like.

In a case of the method for manufacturing a group III nitride semiconductor substrate 1 of the present embodiment, at least one of the plane orientation of the main surface 11 of the sapphire substrate 10 (first factor), the presence or absence of the nitriding treatment during the heat treatment (second factor), and the growth temperature in the buffer layer forming step S30 (third factor) is adjusted such that the growth surface 31 of the group III nitride semiconductor layer 30 has a predetermined plane orientation.

In other words, in the group III nitride semiconductor substrate 1 manufactured by the method for manufacturing the group III nitride semiconductor substrate 1 of the present embodiment, the plane orientation of the growth surface 31 of the group III nitride semiconductor layer 30 and at least one of the first to third factors have a predetermined relationship.

In addition, in the case of the method for manufacturing the group III nitride semiconductor substrate 1 of the present embodiment, at least one of the first to third factors is adjusted such that the growth surface 31 of group III nitride semiconductor layer 30 is in a predetermined surface state.

In other words, in the group III nitride semiconductor substrate 1 manufactured by the method for manufacturing the group III nitride semiconductor substrate 1 of the present embodiment, the surface state of the growth surface 31 of the group III nitride semiconductor layer 30, and at least one of the first to third factors have a predetermined relationship.

Tables 1 to 6 show examples of the predetermined relationships between the first to third factors and the plane orientation and surface state of the growth surface 31 of the group III nitride semiconductor layer 30.

TABLE 1

| Sapphire main surface | Nitriding treatment when raising temperature | Buffer layer growth temperature | Growth surface of group III nitride semiconductor layer | Surface state |
|---|---|---|---|---|
| {10-10} plane or a plane obtained by inclining the {10-10} plane at greater than 0° and 0.5° or less in an arbitrary direction | Present | 1060° C. or higher 1120° C. or lower | {10-12} plane or a plane obtained by inclining the {10-12} plane at greater than 0° and 0.5° or less in an arbitrary direction | C |
| | Absent | | {11-22} plane or a plane obtained by inclining the {11-22} plane at greater than 0° and 0.5° or less in an arbitrary direction | A |
| {10-10} plane or a plane obtained by inclining the {10-10} plane at 1.5° or more and 2.5° or less in the direction in which the {10-10} plane is parallel with the a-plane | Present | 1055° C. or higher 1120 C or lower | Plane obtained by inclining the {11-22} plane at 1.5° or more and 2.5° or less in a direction in which the {11-22} plane is parallel with an m-plane | A |
| | Absent | | {20-27} plane or a plane obtained by inclining the {20-27} plane at greater than 0° and 0.5° or less in an arbitrary direction | C |
| | Present | 800° C. or higher 950° C. or lower | Plane obtained by inclining the {11-23} plane at 10° or less in a direction in which the {11-23} plane is parallel with an m-plane and at 10° or less in a direction in which the {11-23} plane is parallel with the c-plane | C |
| Plane obtained by inclining the {10-10} plane at 4.5° or more and 5.5° or less in the direction in which the {10-10} plane is parallel with the a-plane | Present Absent | 1060° C. or higher 1120° C. or lower | Plane obtained by inclining the {11-22} plane at 4.5° or more and 5.5° or less in a direction in which the {11-22} plane is parallel with the m-plane | A |

TABLE 2

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 9.5° or more and 10.5° or less in the direction in which the {10-10} plane is parallel with the a-plane | Present | 1060° C. or higher 1120 C or lower | Plane obtained by inclining the {11-22} plane at 9.5° or more and 10.5° or less in a direction in which the {11-22} plane is parallel with the m-plane | A |
| | Absent | | {10-15} plane or a plane obtained by inclining the {10-15} plane at greater than 0° and 0.5° or less in an arbitrary direction | |
| Plane obtained by inclining the {10-10} plane at 14.5° or more and 15.5° or less in the direction in which the {10-10} plane is parallel with the a-plane | Present Absent | 1060° C. or higher 1120° C. or lower | {10-17} plane or a plane obtained by inclining the {10-17} plane at greater than 0° and 0.5° or less in an arbitrary direction | A |

TABLE 2-continued

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 19.5° or more and 20.5° or less in the direction in which the {10-10} plane is parallel with the a-plane | Present Absent | 1060° C. or higher 1120° C. or lower | {10-19} plane or a plane obtained by inclining the {10-19} plane at greater than 0° and 0.5° or less in an arbitrary direction | A |

TABLE 3

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 1.5° or more and 2.5° or less in a direction in which the {10-10} plane is parallel with the c-plane | Present Absent Present | 950° C. or higher 1120° C. or lower 800° C. or higher 950° C. or lower | Plane obtained by inclining the {11-22} plane at 1.5° or more and 2.5° or less in the direction in which the {11-22} plane is parallel with the a-plane | B |
| Plane obtained by inclining the {10-10} plane at 4.5° or more and 5.5 or less in a direction in which the {10-10} plane is parallel with the c-plane | Present | 1060 C or higher 1120° C. or lower | {20-27} plane or a plane obtained by inclining the {20-27} plane at greater than 0° and 0.5° or less in an arbitrary direction | C |
| | Absent | | Plane obtained by inclining the {11-22} plane at 4.5° or more and 5.5° or less in the direction in which the {11-22} plane is parallel with the a-plane | B |
| Plane obtained by inclining the {10-10} plane at 9.5° or more and 10.5° or less in a direction in which the {10-10} plane is parallel with the c-plane | Present | 1060° C. or higher 1120° C. or lower | {10-13} plane or plane obtained by inclining the {10-13} plane at greater than 0° and 0.5° or less in an arbitrary direction | C |
| | Absent | | Plane obtained by inclining the {11-22} plane at 9.5° or more and 10.5° or less in the direction in which the {11-22} plane is parallel with the a-plane | |

TABLE 4

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 14.5° or more and 15.5° or less in a direction in which the {10-10} plane is parallel with the c-plane | Present Absent | 1060° C. or higher 1120° C. or lower | {10-13} plane or plane obtained by inclining the {10-13} plane at greater than 0° and 0.5° or less in an arbitrary direction | C |
| Plane obtained by inclining the {10-10} plane at 19.5° or more and 20.5° or less in a direction in which the {10-10} plane is parallel with the c-plane | Present Absent | 1060° C. or higher 1120° C. or lower | {20-27} plane or a plane obtained by inclining the {20-27} plane at greater than 0° and 0.5° or less in an arbitrary direction | C |

TABLE 4-continued

| Sapphire main surface | Nitriding treatment when raising temperature | Buffer layer growth temperature | Growth surface of group III nitride semiconductor layer | Surface state |
|---|---|---|---|---|
| {10-12} plane or a plane obtained by inclining the {10-12} plane at greater than 0° and 0.5° or less in an arbitrary direction | Present Absent | 1060° C. or higher 1120° C. or lower | {11-20} plane or a plane obtained by inclining the {11-20} plane at greater than 0° and 0.5° or less in an arbitrary direction | C |

TABLE 5

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 9.5° or more and 10.5° or less in a direction in which the {10-10} plane is parallel with the first surface | Present | 1075° C. or higher 1125° C. or lower | Plane obtained by inclining the {11-23} plane at 10° or less in a direction in which the {11-23} plane is parallel with the m-plane and inclining at 10° or less in a direction in which the {11-23} plane is parallel with the c-plane | B |
| Plane obtained by inclining the {10-10} plane at 14.5° or more and 15.5° or less in a direction in which the {10-10} plane is parallel with the first surface | Present | 1075° C. or higher 1125° C. or lower | {11-28} plane or a plane obtained by inclining the {11-28} plane at greater than 0° and 0.5° or less in an arbitrary direction | C |
| Plane obtained by inclining the {10-10} plane at 19.5° or more and 20.5° or less in a direction in which the {10-10} plane is parallel with the first surface | Present | 1075° C. or higher 1125° C. or lower | Plane obtained by inclining the {11-2·10} plane at 10° or less in a direction in which the {11-2·10} plane is parallel with the m-plane and inclining at 10° or less in a direction in which the {11-2·10} plane is parallel with the c-plane | C |

TABLE 6

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 29.5° or more and 30.5° or less in the direction in which the {10-10} plane is parallel with the a-plane and | Present | 800° C. or higher 950° C. or lower | Plane obtained by inclining the {11-23} plane at 10° or less in a direction in which the {11-23} plane is parallel with the c-plane | B |

TABLE 6-continued

| Sapphire main surface | Nitriding treatment when raising temperature | Buffer layer growth temperature | Growth surface of group III nitride semiconductor layer | Surface state |
|---|---|---|---|---|
| further inclining at 27.5° or more and 30.5° or less in a direction in which the plane is parallel with the c-plane | | | | |

In Tables 1 to 6, "Sapphire main surface", "Nitriding treatment when raising temperature", "Buffer layer growth temperature", "Growth surface of group III nitride semiconductor layer", and "Surface state" are associated with each other.

The details of the first factor, that is, the plane orientation of the main surface 11 of the sapphire substrate 10 are shown in the column of "Sapphire main surface" in the tables. The details of the second factor, that is, the presence or absence ("Present" or "Absent") of the nitriding treatment during the heat treatment are shown in the column of "Nitriding treatment when raising temperature". The details of the third factor, that is, the growth temperature in the buffer layer forming step S30, are shown in the column of "Buffer layer growth temperature".

The plane orientation of the growth surface 31 of the group III nitride semiconductor layer 30 is shown in the column of "Growth surface of the group III nitride semiconductor layer". The surface state of the growth surface 31 of the group III nitride semiconductor layer 30 is shown in the column of "Surface state".

A surface state which is "A" means a state in which, under differential interference microscope observation, the surface has a mirror surface structure and a grain (crystal grain) boundary is not clearly observed. A surface state which is "B" means a state in which, under differential interference microscope observation, the surface has a mirror surface structure but a grain (crystal grain) boundary is observed. A surface state which is "C" means a state in which the surface is not recognized as a mirror surface.

It is understood from Tables 1 to 6 that it is possible to adjust the plane orientation and the surface state of the growth surface 31 of the group III nitride semiconductor layer 30 by adjusting the first to third factors. Then, from the relationship between the first to third factors and the plane orientation and surface state of the growth surface 31 of the group III nitride semiconductor layer 30 shown in Tables 1 to 6, it is possible to read, for example, the following relationship.

It is understood from Tables 1 and 2 that, in a case where the main surface 11 of the sapphire substrate 10 is a plane inclined from the {10-10} plane by greater than 0° and 12.5° or less in the direction in which the {10-10} plane is parallel with the a-plane, the growth of the {11-22} plane component becomes dominant when the nitriding treatment is performed during the heat treatment. Thus, it is understood that, the growth surface 31 of the group III nitride semiconductor layer 30 is a plane obtained by inclining the {11-22} plane at an angle approximately equal to the inclination angle of the main surface 11 of the sapphire substrate 10 from the {10-10} plane in the direction in which the {11-22} plane is parallel with the m-plane.

In addition, it is understood from Table 2 that, in a case where the main surface 11 of the sapphire substrate 10 is a plane inclined from the {10-10} plane by greater than 12.5° and 22.5° or less in the direction in which the {10-10} plane is parallel with the a-plane, the growth of the {10-1X} plane or the {20-2X} plane component becomes dominant, regardless of the presence or absence of the nitriding treatment during the heat treatment.

In addition, it is understood from Table 3 that, in a case where the main surface 11 of the sapphire substrate 10 is a plane inclined from the {10-10} plane by greater than 0° and 12.5° or less in the direction in which the {10-10} plane is parallel with the c-plane, the growth of the {11-22} plane component becomes dominant when the nitriding treatment is not performed during the heat treatment. Thus, it is understood that the growth surface 31 of the group III nitride semiconductor layer 30 is a plane obtained by inclining the {11-22} plane at an angle approximately equal to the inclination angle of the main surface 11 of the sapphire substrate 10 from the {10-10} plane in the direction in which the {11-22} plane is parallel with the a-plane.

In addition, it is understood from Table 4 that, in a case where the main surface 11 of the sapphire substrate 10 is a plane inclined from the {10-10} plane by greater than 12.5° and 22.5° or less in the direction which the { 10-10} plane is in parallel with the c-plane, the growth of the {10-1X} plane or the {20-2X} plane component becomes dominant, regardless of the presence or absence of the nitriding treatment during the heat treatment.

In addition, it is understood from Table 5 that, in a case where the main surface 11 of the sapphire substrate 10 is a surface inclined in a direction in which the plane is parallel with the first surface, the growth of the {11-22} plane component becomes dominant when a nitriding treatment is performed at the time of heat treatment and the buffer layer 20 is formed at a comparatively high temperature.

In addition, from Table 6, in a case where the main surface 11 of the sapphire substrate 10 is a plane obtained by inclining the {10-10} plane at any angle of 29.5° or more and 30.5° or less in the direction in which the {10-10} plane is parallel with the a-plane and further inclining at any angle of 27.5° or more and 30.5° or less in the direction in which the plane is parallel with the c-plane, it is understood that the growth of the {11-23} plane component becomes dominant when the nitriding treatment is performed during the heat treatment.

In the group III nitride semiconductor substrate 1 obtained by the method for manufacturing a group III nitride semiconductor substrate of the present embodiment, the first to third factors and the plane orientation of the growth surface 31 of the group III nitride semiconductor layer 30 satisfy the predetermined relationships as described above, for example.

In addition, in the group III nitride semiconductor substrate 1 obtained by the method for manufacturing a group III nitride semiconductor substrate of the present embodiment, the first to third factors and the plane orientation and surface state of the growth surface 31 of the group III nitride semiconductor layer 30 satisfy the predetermined relationships shown in, for example, Tables 1 to 6. That is, in the method for manufacturing a group III nitride semiconductor substrate of the present embodiment, for example, the first to third factors are adjusted so as to satisfy any one of a plurality of combinations in which the factors are associated with each other in Tables 1 to 6. Then, the group III nitride semiconductor layer 30 having the growth surface 31 with the plane orientation and the surface state associated with the combination thereof in Tables 1 to 6 is formed.

Here, conditions for forming the group III nitride semiconductor layer 30 in which the growth surface 31 has a predetermined plane orientation and the surface state of the growth surface 31 is favorable will be illustrated.

For example, referring to Table 1 and Table 2, in a case where the sapphire substrate 10 which has, as the main surface 11, a plane obtained by inclining the {10-10} plane at any angle of 4.5° or more and 5.5° or less, 9.5° or more and 10.5° or less, 14.5° or more and 15.5° or less, and 19.5° or more and 20.5° or less in the direction in which the {10-10} plane is parallel with the a-plane is prepared in the sapphire substrate preparation step S10 and the growth temperature is set to 1060° C. or higher and 1120° C. or lower in the buffer layer forming step S30, it is possible to form the group III nitride semiconductor layer 30 in which the growth surface 31 has a predetermined plane orientation and the surface state of the growth surface 31 is favorable.

In addition, referring to Table 2, in a case where the sapphire substrate 10 which has, as the main surface 11, a plane obtained by inclining the {10-10} plane at any angle of 9.5° or more and 10.5° or less in the direction in which the {10-10} plane is parallel with the a-plane is prepared in the sapphire substrate preparation step S10, a heat treatment is performed without performing a nitriding treatment in the heat treatment step S20, and the growth temperature is set to 1060° C. or higher and 1120° C. or lower in the buffer layer forming step S30, it is possible to form the group III nitride semiconductor layer 30 in which the growth surface 31 is either the {10-15} plane or a plane obtained by inclining the {10-15} plane at any angle of greater than 0° and 0.5° or less and the surface state of the growth surface 31 is favorable.

In addition, referring to Table 1, in a case where the sapphire substrate 10 which has, as the main surface 11, a plane obtained by inclining the {10-10} plane at any angle of 1.5° or more and 2.5° or less in the direction in which the {10-10} plane is parallel with the a-plane is prepared in the sapphire substrate preparation step S10, a heat treatment is performed while performing a nitriding treatment in the heat treatment step S20, and the growth temperature is set to 1055° C. or higher and 1120° C. or lower in the buffer layer forming step S30, it is possible to form the group III nitride semiconductor layer 30 in which the growth surface 31 has a predetermined plane orientation and the surface state of the growth surface 31 is favorable.

In addition, referring to Table 1, in a case where the sapphire substrate 10 which has, as the main surface 11, the {10-10} plane or a plane obtained by inclining the {10-10} plane at any angle of greater than 0° and 0.5° or less is prepared in the sapphire substrate preparation step S10, a heat treatment is performed without performing a nitriding treatment in the heat treatment step S20, and the growth temperature is set to 1060° C. or higher and 1120° C. or lower in the buffer layer forming step S30, it is possible to form the group III nitride semiconductor layer 30 in which the growth surface 31 has a predetermined plane orientation, and the surface state of the growth surface 31 is favorable.

In addition, referring to Table 3, in a case where the sapphire substrate 10 which has, as the main surface 11, a plane obtained by inclining the {10-10} plane at any angle of 1.5° or more and 2.5° or less in the direction in which the {10-10} plane is parallel with the c-plane is prepared in the sapphire substrate preparation step S10 and the growth temperature is set to 800° C. or higher and 1120° C. or lower in the buffer layer forming step S30, it is possible to form the group III nitride semiconductor layer 30 in which the growth surface 31 has a predetermined plane orientation and the surface state of the growth surface 31 is favorable.

In addition, referring to Table 3, in a case where the sapphire substrate 10 which has, as the main surface 11, a plane obtained by inclining the {10-10} plane at any angle of 4.5° or more and 5.5° or less in a direction in which the {10-10} plane is parallel with the c-plane is prepared in the sapphire substrate preparation step S10, a heat treatment is performed without performing a nitriding treatment in the heat treatment step S20, and the growth temperature is set to 1060° C. or higher and 1120° C. or lower in the buffer layer forming step S30, it is possible to form the group III nitride semiconductor layer 30 in which the growth surface 31 has a predetermined plane orientation and the surface state of the growth surface 31 is favorable.

In addition, referring to Table 5, in a case where the sapphire substrate 10 which has, as the main surface 11, a plane obtained by inclining the {10-10} plane at any angle of 9.5° or more and 10.5° or less in the direction in which the {10-10} plane is parallel with the first surface (surface in which the c-plane is inclined at 44.5° or more and 45.5° or less in the direction in which the {10-10} plane is parallel with the a-plane) is prepared in the sapphire substrate preparation step S10, a heat treatment is performed while performing a nitriding treatment in the heat treatment step S20, and the growth temperature is set to 1075° C. or higher and 1125° C. or lower in the buffer layer forming step S30, it is possible to form the group III nitride semiconductor layer 30 in which the growth surface 31 has a predetermined plane orientation and the surface state of the growth surface 31 is favorable.

In addition, referring to Table 5, in a case where the sapphire substrate 10 which has, as the main surface 11, a plane obtained by inclining the {10-10} plane at any angle of 19.5° or more and 20.5° or less in the direction in which the {10-10} plane is parallel with the first surface (surface in which the c-plane is inclined at 44.5° or more and 45.5° or less in the direction in which the {10-10} plane is parallel with the a-plane) is prepared in the sapphire substrate preparation step S10, a heat treatment is performed while performing a nitriding treatment in the heat treatment step S20, and the growth temperature is set to 1075° C. or higher and 1125° C. or lower in the buffer layer forming step S30, it is possible to form the group III nitride semiconductor layer 30 in which the growth surface 31 has a predetermined plane orientation and the surface state of the growth surface 31 is favorable.

As described above, according to the present embodiment, a new technique of epitaxially growing a group III nitride semiconductor with a desired semipolar plane as a growth surface is realized.

According to the present embodiment, adjusting at least one of the plane orientation (first factor) of the main surface 11 of the sapphire substrate 10, the presence or absence of a nitriding treatment (second factor) during the heat treatment, and the growth temperature (third factor) in the buffer layer forming step S30 makes it possible to adjust the plane orientation of the growth surface 31 of the group III nitride semiconductor layer 30.

In the group III nitride semiconductor substrate 1 manufactured by the method for manufacturing the group III nitride semiconductor substrate 1 of the present embodiment, the plane orientation of the growth surface 31 of the group III nitride semiconductor layer 30 and at least one of the first to third factors have a predetermined relationship (example: the relationships shown in Tables 1 to 6).

A substrate (hereinafter, a "substrate for comparison"), which is cut out from a group III nitride semiconductor crystal epitaxially grown with the +c-plane as a growth surface such that the semipolar plane is a cut plane, is different from the group III nitride semiconductor substrate 1 of the present embodiment. Since the growth surface in the substrate for comparison is a +c-plane and is not a semipolar plane, the substrate for comparison is clearly different from the group III nitride semiconductor substrate 1 of the present embodiment.

The surface morphology differs between epitaxial growth with the +c-plane as the growth surface and epitaxial growth with the {X0-XY} plane (X and Y are positive integers other than 0) as the growth surface. For this reason, when the surface is observed using a differential interference microscope, it is possible to distinguish the substrate for comparison and the group III nitride semiconductor substrate 1 of the present embodiment.

Specifically, while the surface of the substrate for comparison obtained based on epitaxial growth with the +c-plane as the growth surface has a mirror surface structure which does not have a unique structure, the surface of the group III nitride semiconductor substrate 1 of the present embodiment in which the {X0-XY} plane (X and Y are positive integers other than 0) is the growth surface is a mirror surface structure with a streak structure extending in the a-axis direction or a non-mirror surface structure having unevenness.

Forming a device such as an electronic device or an optical device on the group III nitride semiconductor substrate 1 of the present embodiment in which the semipolar plane is exposed makes it possible to increase the internal quantum efficiency to a greater degree than in a case of forming the device on the c-plane.

In addition, according to the present embodiment, adjusting at least one of the plane orientation (first factor) of the main surface 11 of the sapphire substrate 10, the presence or absence of a nitriding treatment (second factor) during the heat treatment, and the growth temperature (third factor) in the buffer layer forming step S30 makes it possible to adjust the surface state of the growth surface 31 of the group III nitride semiconductor layer 30.

In the group III nitride semiconductor substrate 1 manufactured by the method for manufacturing the group III nitride semiconductor substrate 1 of the present embodiment, the surface state of the growth surface 31 of the group III nitride semiconductor layer 30 and at least one of the first to third factors have a predetermined relationship (example: the relationships shown in Tables 1 to 6).

According to the group III nitride semiconductor layer in which the surface state of the growth surface 31 is favorable, the crystallinity and the electrical characteristics of the device of the group III nitride semiconductor produced thereon are not impaired, and the characteristics thereof are improved.

In addition, according to the present embodiment, adjusting at least one of the plane orientation (first factor) of the main surface 11 of the sapphire substrate 10, the presence or absence of a nitriding treatment (second factor) during the heat treatment, and the growth temperature (third factor) in the buffer layer forming step S30 makes it possible to obtain the group III nitride semiconductor substrate 1 having the group III nitride semiconductor layer 30 in which the growth surface 31 has a predetermined plane orientation.

For example, it is possible to obtain the group III nitride semiconductor substrate 1 (refer to FIG. 2(3) and FIG. 4) having the group III nitride semiconductor layer 30 in which the plane orientation of the growth surface 31 is either the {10-15} plane or a plane obtained by inclining the {10-15} plane at any angle of greater than 0° and 0.5° or less.

The present inventors confirmed that "the group III nitride semiconductor substrate 1 having the group III nitride semiconductor layer 30 in which the plane orientation of the growth surface 31 is either the {10-15} plane or a plane obtained by inclining the {10-15} plane at any angle of greater than 0° and 0.5° or less" obtained by the manufacturing method of the present embodiment is flat in the surface morphology and the crystallinity of the group III nitride semiconductor forming the group III nitride semiconductor layer 30 is favorable (equivalent to the group III nitride semiconductor grown on the c-plane).

According to such a group III nitride semiconductor substrate 1, it is possible to manufacture a high-quality device with high internal quantum efficiency.

In addition, it is possible to obtain the group III nitride semiconductor substrate 1 (refer to FIG. 2(3) and FIG. 4) having the group III nitride semiconductor layer 30 in which the plane orientation of the growth surface 31 is the {11-22} plane or the {11-23} plane. Although such a group III nitride semiconductor substrate 1 is inferior in surface flatness, since the side surface portion or the inclined surface thereof is the m-plane, it is possible to produce a laser device comparatively easily by producing an optical mirror structure by cleaving at this surface.

First Embodiment

A plurality of the sapphire substrates 10 with various plane orientations (first factor) of the main surface 11 were prepared. The sapphire substrate 10 had a thickness of 430 μm and a diameter of 2 inches.

Then, heat treatment was performed on each of the prepared sapphire substrates 10 under the following conditions.

Temperature: 950° C. to 1100° C.
Pressure: 200 torr
Heat treatment time: 10 minutes or 15 minutes
Carrier gas: $H_2$, $N_2$
$H_2$ (carrier gas) supply rate: 4.0 slm to 9.0 Slm
$N_2$ (carrier gas) supply rate: 1.5 slm In addition, samples were created in which the presence or absence (second factor) of the nitriding treatment during the heat treatment was varied. Specifically, both of a sample in which $NH_3$ was supplied at 30 slm or less and a nitriding treatment was performed during the heat treatment and a sample in which $NH_3$ was not supplied and a nitriding treatment was not performed during the heat treatment were created.

After the heat treatment, a buffer layer 20 (AlN buffer layer) having a thickness of approximately 150 nm was formed on the main surface 11 (exposed surface) of the sapphire substrate 10 under the following conditions.

Growth method: MOCVD method
Pressure: 100 torr

V/III ratio: 5184
TMAl supply rate: 50 sccm to 100 sccm
NH$_3$ supply rate: 1 to 5 slm
Carrier gas: H$_2$
H$_2$ (carrier gas) supply rate: 4.0 slm to 9.0 slm
N$_2$ (carrier gas) supply rate: 1.5 slm The growth temperature (third factor) was varied in the range of 800° C. or higher and 1120° C. or lower for each sample.

Thereafter, a group III nitride semiconductor layer 30 (GaN layer) having a thickness of approximately 15 μm was formed on the buffer layer 20 under the following conditions.
Growth method: MOCVD method
Growth temperature: 1000° C. to 1080° C.
Pressure: 100 to 500 torr
V/III ratio: 200 to 900
TMGa supply rate: 50 to 500 ccm (continuous change)
NH$_3$ supply rate: 2 to 16 slm (continuous change)
Carrier gas: H$_2$, N$_2$
H$_2$ (carrier gas) supply rate: 13.5 slm
N$_2$ (carrier gas) supply rate: 1.5 slm As described above, the group III nitride semiconductor substrate 1 was manufactured in which the sapphire substrate 10, the buffer layer 20, and the group III nitride semiconductor layer 30 were laminated in this order.

Tables 7 to 12 show the relationships between the plane orientation (first factor) of the main surface 11 of the sapphire substrate 10, the presence or absence of a nitriding treatment (second factor) during the heat treatment, and the growth temperature (third factor) at the time of forming the buffer layer 20, and the plane orientation and the surface state of the growth surface 31 of the obtained group III nitride semiconductor layer 30.

TABLE 7

| Sapphire main surface | Nitriding treatment when raising temperature | Buffer layer growth temperature | Growth surface of group III nitride semiconductor layer | Surface state |
|---|---|---|---|---|
| {10 10} plane | Present | 1060° C. or higher 1120° C. or lower | {10-12} plane | C |
| | Absent | | {11-22} plane | A |
| Plane obtained by inclining the {10-10} plane at 2.0° in the direction in which the {10-10} plane is parallel with the a-plane | Present | 1055° C. or higher 1120° C. or lower | Plane obtained by inclining the {11-22} plane at 2.0° in a direction in which the {11-22} plane is parallel with the m-plane | A |
| | Absent | | {20-27} plane | C |
| | Present | 800° C. or higher 950° C. or lower | Plane obtained by inclining the {11-23} plane at 8.5° in a direction in which the {11-23} plane is parallel with the m-plane and inclined at 4.5° in a direction in which the {11-23} plane is parallel with the c-plane | C |
| Plane obtained by inclining the {10-10} plane at 5.0° in the direction in which the {10-10} plane is parallel with the a-plane | Present Absent | 1060° C. or higher 1120° C. or lower | Plane obtained by inclining the {11-22} plane at 5.0° in a direction in which the {11-22} plane is parallel with the m-plane | A |

TABLE 8

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 10.0° in the direction in which the {10-10} plane is parallel with the a-plane | Present | 1060° C. or higher 1120° C. or lower | Plane obtained by inclining the {11-22} plane at 10.0° in a direction in which the {11-22} plane is parallel with the m-plane | A |
| | Absent | | {10-15} plane | |
| Plane obtained by inclining the {10-10} plane at 15.0° in the direction in which | Present Absent | 1060° C. or higher 1120° C. or lower | {10-17} plane | A |

TABLE 8-continued

| Sapphire main surface | Nitriding treatment when raising temperature | Buffer layer growth temperature | Growth surface of group III nitride semiconductor layer | Surface state |
|---|---|---|---|---|
| the {10-10} plane is parallel with the a-plane | | | | |
| Plane obtained by inclining the {10-10} plane at 20.0° in the direction in which the {10-10} plane is parallel with the a-plane | Present Absent | 1060° C. or higher 1120° C. or lower | {10-19} plane | A |

TABLE 9

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 2.0° in a direction in which the {10-10} plane is parallel with the c-plane | Present Absent Present | 950° C. or higher 1120° C. or lower 800° C. or higher 950° C. or lower | Plane obtained by inclining the {11-22} plane at 2.0° in the direction in which the {11-22} plane is parallel with the a-plane | B |
| Plane obtained by inclining the {10-10} plane at 5.0° in a direction in which the {10-10} plane is parallel with the c-plane | Present Absent | 1060° C. or higher 1120° C. or lower | {20-27} plane Plane obtained by inclining the {11-22} plane at 5.0° in the direction in which the {11-22} plane is parallel with the a-plane | C B |
| Plane obtained by inclining the {10-10} plane at 10.0° in a direction in which the {10-10} plane is parallel with the c-plane | Present Absent | 1060° C. or higher 1120° C. or lower | {10-13} plane Plane obtained by inclining the {11-22} plane at 10.0° in the direction in which the {11-22} plane is parallel with the a-plane | C |

TABLE 10

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 15.0° in a direction in which the {10-10} plane is parallel with the c-plane | Present Absent | 1060° C. or higher 1120° C. or lower | {10-13} plane | C |
| Plane obtained by inclining the {10-10} plane at 20.0° in a direction in which the {10-10} plane is parallel with the c-plane | Present Absent | 1060° C. or higher 1120° C. or lower | {20-27} plane | C |
| {10 12} plane | Present Absent | 1060° C. or higher 1120° C. or lower | {11-20} plane | C |

TABLE 11

| Sapphire main surface | Nitriding treatment when raising temperature | Buffer layer growth temperature | Growth surface of group III nitride semiconductor layer | Surface state |
|---|---|---|---|---|
| Plane obtained by inclining the {10-10} plane at 10.0° in a direction in which the {10-10} plane is parallel with the first surface | Present | 1075° C. or higher 1125° C. or lower | Plane obtained by inclining the {11-23} plane at 10.0° in a direction in which the {11-23} plane is parallel with the m-plane | B |
| Plane obtained by inclining the {10-10} plane at 15.0° in a direction in which the {10-10} plane is parallel with the first surface | Present | 1075° C. or higher 1125° C. or lower | {11-28} plane | C |
| Plane obtained by inclining the {10-10} plane at 20.0° in a direction in which the {10-10} plane is parallel with the first surface | Present | 1075° C. or higher 1125° C. or lower | Plane obtained by inclining the {11-2·10} plane at 10.0° in a direction in which the {11-2·10} plane is parallel with the m-plane | C |

TABLE 12

| Sapphire main surface | Nitriding treatment when raising temperature | Buffer layer growth temperature | Growth surface of group III nitride semiconductor layer | Surface state |
|---|---|---|---|---|
| {11-23} plane | Present | 800° C. or higher 950° C. or lower | Plane obtained by inclining the {11-23} plane at 4.0° in a direction in which the {11-23} plane is parallel with the c-plane | B |

A surface state which is "A" means a state in which, under differential interference microscope observation, the surface has a mirror surface structure and a grain (crystal grain) boundary is not clearly observed. A surface state which is "B" means a state in which the surface has a mirror surface structure under differential interference microscope observation, but a grain (crystal grain) boundary is observed. A surface state which is "C" means that the surface is not recognized as a mirror surface.

Tables 7 to 12 show the same corresponding relationships as in Tables 1 to 6. This result shows that when at least one of the plane orientation (first factor) of the main surface 11 of the sapphire substrate 10, the presence or absence of nitriding treatment (second factor) during the heat treatment, and the growth temperature (third factor) in the buffer layer forming step S30 is adjusted, it is possible to adjust the plane orientation and the surface state of the growth surface 31 of the group III nitride semiconductor layer 30 with the relationships as shown in Tables 1 to 6.

Second Embodiment

Figure 5:
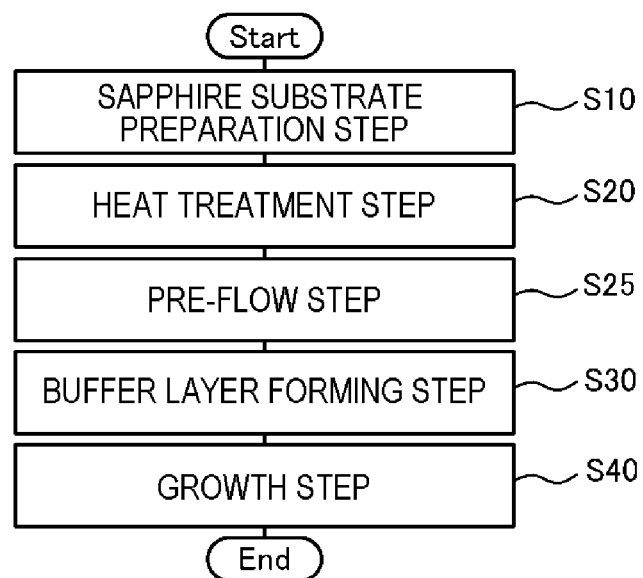
FIG. 5 is a step diagram showing an example of a processing flow of the method for manufacturing a group III nitride semiconductor substrate of the present embodiment.

FIG. 5 is a flowchart showing an example of the processing flow of the method for manufacturing a group III nitride semiconductor substrate of the present embodiment. As illustrated, the method for manufacturing a group III nitride semiconductor substrate of the present embodiment has the sapphire substrate preparation step S10, the heat treatment step S20, a pre-flow step S25, the buffer layer forming step S30, and the growth step S40. Furthermore, the method may have a removal step S50. According to the present embodiment, it is possible to form the group III nitride semiconductor layer 30 by epitaxially growing a group III nitride semiconductor with the desired semipolar plane on the N-polarity side as a growth surface. A description will be given below of each step.

The sapphire substrate preparation step S10 is the same as in the first embodiment.

In the heat treatment step S20, the heat treatment is performed on the sapphire substrate 10 while performing the nitriding treatment or without performing the nitriding treatment. The conditions of the heat treatment are as follows.

Temperature: 800° C. or higher and 1200° C. or lower
Pressure: 30 torr or more to 760 torr or less
Heat treatment time: 5 minutes or more and 20 minutes or less
Carrier gas: $H_2$, or $H_2$ and $N_2$ ($H_2$ ratio 0 to 100%)
Carrier gas supply rate: 3 slm to 50 slm In a case where the heat treatment is performed while performing the nitriding treatment, $NH_3$ is supplied at 30 slm or less during the heat treatment. In a case where the heat treatment is performed without performing the nitriding treatment, $NH_3$ is not supplied during the heat treatment.

In the pre-flow step S25, trimethylaluminum is supplied onto the sapphire substrate 10 before the buffer layer forming step S30, under the following conditions.

Temperature: 500° C. or higher and 1000° C. or lower

Pressure: 30 torr or more and 200 torr or less

Trimethylaluminum supply rate, supply time: 20 ccm or more and 500 ccm or less, 1 second or more and 60 seconds or less Carrier gas: $H_2$, or $H_2$ and $N_2$ ($H_2$ ratio 0 to 100%)

Carrier gas supply rate: 3 slm or more and 50 slm or less

The conditions described above are in a case of supplying trimethylaluminum and triethylaluminum, which are organic metal materials, as the metal-containing gas. In this step, a metal-containing gas containing another metal may be supplied instead of trimethylaluminum triethylaluminum, and another metal film such as a titanium film, a vanadium film, or a copper film may be formed on the main surface of the sapphire substrate instead of the aluminum film. In addition, other metal carbide films such as aluminum carbide, titanium carbide, vanadium carbide, and copper carbide, which are reaction films with hydrocarbon compounds such as methane, ethylene, or ethane generated from organic metal raw materials, may be formed on the main surface of the sapphire substrate.

In the buffer layer forming step S30, as shown in FIG. 2(2), the buffer layer 20 is formed on the main surface 11 of the sapphire substrate 10 after the heat treatment. The thickness of the buffer layer 20 to be formed is, for example, 20 nm or more and 300 nm or less.

The buffer layer 20 is, for example, an AlN layer. For example, the buffer layer 20 may be formed by epitaxially growing an AlN crystal under the following conditions.

Growth method: MOCVD method

Growth temperature: 800° C. or higher and 1000° C. or lower

Pressure: 30 torr or more and 200 torr or less

V/III ratio: 3000 or more and 6000 or less

TMAl supply rate: 20 ccm or more and 500 ccm or less $NH_3$ supply rate: 0.5 slm or more and 10 slm or less Carrier gas: $H_2$, or $H_2$ and $N_2$ ($H_2$ ratio 0 to 100%)

Carrier gas supply rate: 50 slm or less

The growth conditions (comparatively low growth temperature and comparatively low pressure) in the buffer layer forming step S30 are conditions for growing AlN while maintaining the N-polarity. That is, the growth conditions in the buffer layer forming step S30 are one of a plurality of factors for setting the plane orientation of the growth surface 31 of the group III nitride semiconductor layer 30 grown in the growth step S40 to the N-polarity side.

In the growth step S40, as shown in FIG. 2(3), the group III nitride semiconductor layer 30 is formed in which the group III nitride semiconductor crystal (example: GaN crystal) is epitaxially grown on the buffer layer 20 under the following growth conditions, and the growth surface 31 has a predetermined plane orientation. The thickness of the group III nitride semiconductor layer 30 is, for example, 1 μm or more and 20 μm or less.

Growth method: MOCVD method

Growth temperature: 800° C. or higher and 1050° C. or lower

Pressure: 30 torr or more and 200 torr or less

V/III ratio: 200 or more and 900 or less

TMGa supply rate: 50 ccm or more and 1000 ccm or less $NH_3$ supply rate: 1 slm or more and 20 slm or less Growth rate: 10 μm/h or more Carrier gas: $H_2$ and $N_2$ ($H_2$ ratio 0 to 100%)

Carrier gas supply rate: 50 slm or less

The growth conditions (comparatively low growth temperature, comparatively low pressure, comparatively fast growth rate) in the growth step S40 are conditions for growing GaN while maintaining the N-polarity. That is, the growth conditions in the growth step S40 are one of a plurality of factors for setting the plane orientation of the growth surface 31 of the group III nitride semiconductor layer 30 grown in the growth step S40 to a plane on the N-polarity side.

The removal step S50 is the same as in the first embodiment.

According to the present embodiment described above, adjusting execution of the pre-flow step S25, the growth conditions in the growth step S40, or the like makes it possible to set the plane orientation of the growth surface 31 of the group III nitride semiconductor layer 30 to a plane on the N-polarity side. In addition, adjusting the first to third factors described above makes it possible to adjust the plane orientation of the growth surface 31 of the group III nitride semiconductor layer 30 to a desired plane orientation.

In addition, according to the present embodiment, it is possible to form the group III nitride semiconductor layer 30 in which the semipolar plane on the N-polarity side is the growth surface 31. In such a case, in addition to the reduction of piezoelectric polarization, it is possible to reduce spontaneous polarization. As a result, it is possible to suppress the Stark effect caused by the internal electric field.

Second Embodiment

The sapphire substrate 10 was prepared in which the plane orientation (first factor) of the main surface 11 is a plane obtained by inclining the m-plane at 2° in the direction in which the m-plane is parallel with the a-plane direction. The sapphire substrate 10 had a thickness of 430 μm and a diameter of 2 inches.

Then, heat treatment was performed on each of the prepared sapphire substrates 10 under the following conditions.

Temperature: 800° C. or higher and 1120° C. or lower

Pressure: 200 torr

Heat treatment time: 10 minutes or 15 minutes

Carrier gas: $H_2$, $N_2$ $H_2$ (carrier gas) supply rate: 4.0 slm to 20 slm $NH_3$ supply rate: 20 slm or less After the heat treatment, trimethylaluminum was supplied onto the main surface 11 (exposed surface) of the sapphire substrate 10 under the following conditions.

Temperature: 900 to 930° C.

Pressure: 100 torr

Trimethylaluminum supply rate, supply time: 90 sccm, 10 seconds

Carrier gas: $H_2$, $N_2$

Carrier gas supply rate: 15 slm

After trimethylaluminum was supplied, the buffer layer 20 (AlN buffer layer) having a thickness of approximately 150 nm was formed on the main surface 11 (exposed surface) of the sapphire substrate 10 under the following conditions.

Growth method: MOCVD method

Pressure: 100 torr

V/III ratio: 5184

TMAl supply rate: 50 ccm

NH$_3$ supply rate: 1 to 5 slm
Carrier gas: H$_2$
H$_2$ (carrier gas) supply rate: 4.0 slm to 15 slm
Growth temperature: 800° C. or higher and 930° C. or lower Thereafter, a group III nitride semiconductor layer 30 (GaN layer) having a thickness of approximately 15 μm was formed on the buffer layer 20 under the following conditions.

Growth method: MOCVD method
Pressure: 100 torr
V/III ratio: 321
TMGa supply rate: 50 sccm to 500 sccm (continuous change)
NH$_3$ supply rate: 5 slm to 10 slm (continuous change)
Carrier gas: H$_2$, N$_2$
H$_2$ (carrier gas) supply rate: 13.5 slm
N$_2$ (carrier gas) supply rate: 1.5 slm A sample 1 in which the group III nitride semiconductor layer 30 was formed at a growth temperature of 1050° C. or lower and a sample 2 in which the group III nitride semiconductor layer 30 was formed at a growth temperature of higher than 1050° C. were prepared.

The plane orientation of the growth surface of the group III nitride semiconductor layer 30 of the sample 1 was a plane obtained by inclining the (−1-12-3) plane at 10° or less in the direction in which the (−1-12-3) plane is parallel with the m-plane. On the other hand, the plane orientation of the growth surface of the group III nitride semiconductor layer 30 of the sample 2 was a plane obtained by inclining the (11-23) plane at 10° or less in the direction in which the (11-23) plane is parallel with the m-plane. That is, it was confirmed that it was possible to set the plane orientation of the growth surface 31 of the nitride semiconductor layer 30 to a plane on the N-polarity side by adjusting the execution of the pre-flow step S25 and the growth conditions (in particular, growth temperature) in the growth step S40, or the like.

Examples of reference forms are added below.

1. A method for manufacturing a group III nitride semiconductor substrate, the method including:
   a sapphire substrate preparation step for preparing a sapphire substrate having, as a main surface, a {10-10} plane or a plane obtained by inclining the {10-10} plane at a predetermined angle in a predetermined direction;
   a heat treatment step for performing a heat treatment on the sapphire substrate while performing a nitriding treatment or without performing the nitriding treatment;
   a buffer layer forming step for forming a buffer layer over the main surface of the sapphire substrate after the heat treatment; and
   a growth step for forming a group III nitride semiconductor layer, in which a growth surface has a predetermined plane orientation, over the buffer layer,
   in which at least one of a plane orientation of the main surface of the sapphire substrate, presence or absence of the nitriding treatment during the heat treatment, and a growth temperature in the buffer layer forming step is adjusted such that the growth surface of the group III nitride semiconductor layer has the predetermined plane orientation.

2. A method for manufacturing a group III nitride semiconductor substrate, the method including:
   a sapphire substrate preparation step for preparing a sapphire substrate having, as a main surface, a {10-10} plane or a plane obtained by inclining the {10-10} plane at a predetermined angle in a predetermined direction;
   a heat treatment step for performing a heat treatment on the sapphire substrate at a temperature of 1060° C. or higher and 1120° C. or lower while performing a nitriding treatment or without performing the nitriding treatment;
   a buffer layer forming step for forming a buffer layer at a growth temperature of 800° C. or higher and 1125° C. or lower over the main surface of the sapphire substrate after the heat treatment; and
   a growth step for forming a group III nitride semiconductor layer over the buffer layer.

3. The method for manufacturing a group III nitride semiconductor substrate according to 1 or 2, in which the sapphire substrate having, as the main surface, a plane obtained by inclining the {10-10} plane at any angle of 4.5° or more and 5.5° or less, 9.5° or more and 10.5° or less, 14.5° or more and 15.5° or less, and 19.5° or more and 20.5° or less in a direction in which the {10-10} plane is parallel with an a-plane is prepared in the sapphire substrate preparation step, and
   the growth temperature is set to 1060° C. or higher and 1120° C. or lower in the buffer layer forming step.

4. The method for manufacturing a group III nitride semiconductor substrate according to 1 or 2,
   in which the sapphire substrate having, as the main surface, a plane obtained by inclining the {10-10} plane at any angle of 1.5° or more and 2.5° or less in a direction in which the {10-10} plane is parallel with an a-plane, is prepared in the sapphire substrate preparation step,
   the heat treatment is performed while performing the nitriding treatment in the heat treatment step, and
   the growth temperature is set to 1055° C. or higher and 1120° C. or lower in the buffer layer forming step.

5. The method for manufacturing a group III nitride semiconductor substrate according to 1 or 2,
   in which the sapphire substrate having, as the main surface, the {10-10} plane or a plane obtained by inclining the {10-10} plane at any angle of greater than 0° and 0.5° or less is prepared in the sapphire substrate preparation step,
   the heat treatment is performed without performing the nitriding treatment in the heat treatment step, and
   the growth temperature is set to 1060° C. or higher and 1120° C. or lower in the buffer layer forming step.

6. The method for manufacturing a group III nitride semiconductor substrate according to 1 or 2,
   in which the sapphire substrate having, as the main surface, a plane obtained by inclining the {10-10} plane at any angle of 1.5° or more and 2.5° or less in a direction in which the {10-10} plane is parallel with a c-plane is prepared in the sapphire substrate preparation step, and
   the growth temperature is set to 800° C. or higher and 1120° C. or lower in the buffer layer forming step.

7. The method for manufacturing a group III nitride semiconductor substrate according to 1 or 2,
   in which the sapphire substrate having, as the main surface, a plane obtained by inclining the {10-10} plane at any angle of 4.5° or more and 5.5° or less in a direction in which the {10-10} plane is parallel with a c-plane is prepared in the sapphire substrate preparation step,
   the heat treatment is performed without performing the nitriding treatment in the heat treatment step, and
   the growth temperature is set to 1060° C. or higher and 1120° C. or lower in the buffer layer forming step.

8. The method for manufacturing a group III nitride semiconductor substrate according to 1 or 2,
   in which the sapphire substrate having, as the main surface, a plane obtained by inclining the {10-10} plane at any angle of 9.5° or more and 10.5° or less in a direction in which the {10-10} plane is parallel with a first surface is prepared in the sapphire substrate preparation step, the heat treatment is performed while performing the nitriding treatment in the heat treatment step, the growth temperature is set to 1075° C. or higher and 1125° C. or lower in the buffer layer forming step, and the first surface is a plane obtained by inclining a c-plane at 44.5° or more and 45.5° or less in a direction in which the c-plane is parallel with an a-plane.

9. The method for manufacturing a group III nitride semiconductor substrate according to 1 or 2, in which the sapphire substrate having, as the main surface, a plane obtained by inclining the {10-10} plane at any angle of 19.5° or more and 20.5° or less in a direction in which the {10-10} plane is parallel with a first surface is prepared in the sapphire substrate preparation step, the heat treatment is performed while performing the nitriding treatment in the heat treatment step, the growth temperature is set to 1075° C. or higher and 1125° C. or lower in the buffer layer forming step, and the first surface is a plane obtained by inclining a c-plane at 44.5° or more and 45.5° or less in a direction in which the c-plane is parallel with an a-plane.

10. The method for manufacturing a group III nitride semiconductor substrate according to 1 or 2, in which the sapphire substrate having, as the main surface, a plane obtained by inclining the {10-10} plane at any angle of 29.5° or more and 30.5° or less in a direction in which the {10-10} plane is parallel with an a-plane is further inclined at any angle of 27.5° or more and 30.5° or less in a direction in which the {10-10} plane is parallel with a c-plane, is prepared in the sapphire substrate preparation step, the heat treatment is performed while performing the nitriding treatment in the heat treatment step, and the growth temperature is set to 800° C. or higher and 950° C. or lower in the buffer layer forming step.

11. The method for manufacturing a group III nitride semiconductor substrate according to any one of 1 to 10, the method further including:

a removal step for removing the sapphire substrate after the growth step.

12. The method for manufacturing a group III nitride semiconductor substrate according to 1, the method further including:

a pre-flow step for supplying a metal-containing gas over the sapphire substrate after the heat treatment step before the buffer layer forming step, in which the group III nitride semiconductor layer is formed at the growth temperature of 800° C. or more and 1050° C. or less in the growth step.

13. A group III nitride semiconductor substrate including:

a group III nitride semiconductor layer formed of a group III nitride semiconductor crystal, in which a plane orientation of a growth surface is either a {10-15} plane or a plane obtained by inclining the {10-15} plane at any angle of greater than 0° and 0.5° or less. 14. The group III nitride semiconductor substrate according to 13, in which the growth surface is a part of a surface of the group III nitride semiconductor layer, the group III nitride semiconductor substrate further including a sapphire substrate that is positioned on a surface side opposite to the growth surface and that is integral with the group III nitride semiconductor layer.

15. The group III nitride semiconductor substrate according to 14, in which the sapphire substrate has a main surface which is a plane obtained by inclining a {10-10} plane at any angle of 9.5° or more and 10.5° or less in a direction in which the {10-10} plane is parallel with an a-plane, and the group III nitride semiconductor layer is positioned over the main surface.

This application claims priority based on Japanese Patent Application No. 2017-1758 filed on Jan. 10, 2017, the entire disclosure of which is incorporated herein.

The invention claimed is:

1. A method for manufacturing a group III nitride semiconductor substrate, the method comprising:
   a sapphire substrate preparation step for preparing a sapphire substrate having, as a main surface, a {10-10} plane or a plane obtained by inclining the {10-10} plane at a predetermined angle in a predetermined direction;
   a heat treatment step for performing a heat treatment on the sapphire substrate while performing a nitriding treatment or without performing the nitriding treatment;
   a buffer layer forming step for forming a buffer layer over the main surface of the sapphire substrate after the heat treatment; and
   a growth step for forming a group III nitride semiconductor layer, in which a growth surface has a predetermined plane orientation, over the buffer layer,
   wherein at least one of a plane orientation of the main surface of the sapphire substrate, presence or absence of the nitriding treatment during the heat treatment, and a growth temperature in the buffer layer forming step is adjusted such that the growth surface of the group III nitride semiconductor layer has the predetermined plane orientation.

2. The method for manufacturing a group III nitride semiconductor substrate according to claim 1, the method further comprising:
   a pre-flow step for supplying a metal-containing gas over the sapphire substrate between the heat treatment step and the buffer layer forming step,
   wherein the group III nitride semiconductor layer is formed at the growth temperature of 800° C. or more and 1050° C. or less in the growth step.

3. A method for manufacturing a group III nitride semiconductor substrate, the method comprising:
   a sapphire substrate preparation step for preparing a sapphire substrate having, as a main surface, a {10-10} plane or a plane obtained by inclining the {10-10} plane at a predetermined angle in a predetermined direction;
   a heat treatment step for performing a heat treatment on the sapphire substrate at a temperature of 1060° C. or higher and 1120° C. or lower while performing a nitriding treatment or without performing the nitriding treatment;
   a buffer layer forming step for forming a buffer layer at a growth temperature of 800° C. or higher and 1125° C. or lower over the main surface of the sapphire substrate after the heat treatment; and
   a growth step for forming a group III nitride semiconductor layer over the buffer layer.

4. The method for manufacturing a group III nitride semiconductor substrate according to claim 3,
   wherein the sapphire substrate having, as the main surface, a plane obtained by inclining the {10-10} plane at any angle of 19.5° or more and 20.5° or less in a direction in which the {10-10} plane is parallel with a first surface is prepared in the sapphire substrate preparation step, the heat treatment is performed while performing the nitriding treatment in the heat treatment step, the growth temperature is set to 1075° C. or higher and 1125° C. or lower in the buffer layer forming step, and the first surface is a plane obtained by inclining a c-plane at 44.5° or more and 45.5° or less in a direction in which the c-plane is parallel with an a-plane.

5. The method for manufacturing a group III nitride semiconductor substrate according to claim 3, wherein the sapphire substrate having, as the main surface, a plane obtained by inclining the {10-10} plane at any angle of 9.5° or more and 10.5° or less in a direction in which the {10-10} plane is parallel with a first surface is prepared in the sapphire substrate preparation step, the heat treatment is performed while performing the nitriding treatment in the heat treatment step, the growth temperature is set to 1075° C. or higher and 1125° C. or lower in the buffer layer forming step, and the first surface is a plane obtained by inclining a c-plane at 44.5° or more and 45.5° or less in a direction in which the c-plane is parallel with an a-plane.

6. The method for manufacturing a group III nitride semiconductor substrate according to claim 3, wherein the sapphire substrate having, as the main surface, a plane obtained by inclining the {10-10} plane at any angle of 29.5° or more and 30.5° or less in a direction in which the {10-10} plane is parallel with an a-plane and further inclining at any angle of 27.5° or more and 30.5° or less in a direction in which the plane is parallel with a c-plane, is prepared in the sapphire substrate preparation step, the heat treatment is performed while performing the nitriding treatment in the heat treatment step, and the growth temperature is set to 800° C. or higher and 950° C. or lower in the buffer layer forming step.

7. The method for manufacturing a group III nitride semiconductor substrate according to claim 3, wherein the sapphire substrate having, as the main surface, a plane obtained by inclining the {10-10} plane at any angle of 4.5° or more and 5.5° or less in a direction in which the {10-10} plane is parallel with a c-plane is prepared in the sapphire substrate preparation step, the heat treatment is performed without performing the nitriding treatment in the heat treatment step, and the growth temperature is set to 1060° C. or higher and 1120° C. or lower in the buffer layer forming step.

8. The method for manufacturing a group III nitride semiconductor substrate according to claim 3, wherein the sapphire substrate having, as the main surface, a plane obtained by inclining the {10-10} plane at any angle of 1.5° or more and 2.5° or less in a direction in which the {10-10} plane is parallel with an a-plane, is prepared in the sapphire substrate preparation step, the heat treatment is performed while performing the nitriding treatment in the heat treatment step, and the growth temperature is set to 1055° C. or higher and 1120° C. or lower in the buffer layer forming step.

9. The method for manufacturing a group III nitride semiconductor substrate according to claim 3, wherein the sapphire substrate having, as the main surface, a plane obtained by inclining the {10-10} plane at any angle of 4.5° or more and 5.5° or less, 9.5° or more and 10.5° or less, 14.5° or more and 15.5° or less, and 19.5° or more and 20.5° or less in a direction in which the {10-10} plane is parallel with an a-plane is prepared in the sapphire substrate preparation step, and the growth temperature is set to 1060° C. or higher and 1120° C. or lower in the buffer layer forming step.

10. The method for manufacturing a group III nitride semiconductor substrate according to claim 3, wherein the sapphire substrate having, as the main surface, the {10-10} plane or a plane obtained by inclining the {10-10} plane at any angle of greater than 0° and 0.5° or less is prepared in the sapphire substrate preparation step, the heat treatment is performed without performing the nitriding treatment in the heat treatment step, and the growth temperature is set to 1060° C. or higher and 1120° C. or lower in the buffer layer forming step.

11. The method for manufacturing a group III nitride semiconductor substrate according to claim 3, wherein the sapphire substrate having, as the main surface, a plane obtained by inclining the {10-10} plane at any angle of 1.5° or more and 2.5° or less in a direction in which the {10-10} plane is parallel with a c-plane is prepared in the sapphire substrate preparation step, and the growth temperature is set to 800° C. or higher and 1120° C. or lower in the buffer layer forming step.

12. The method for manufacturing a group III nitride semiconductor substrate according to claim 3, the method further comprising:

a removal step for removing the sapphire substrate after the growth step.

13. A group III nitride semiconductor substrate comprising:

a sapphire substrate having a main surface which is a plane obtained by inclining a {10-10} plane at any angle of 9.5° or more and 10.5° or less in a direction in which the {10-10} plane is parallel with an a-plane; and a group III nitride semiconductor layer positioned over the main surface of the sapphire substrate and formed of a group III nitride semiconductor crystal, in which a plane orientation of a growth surface is either of a {10-15} plane or a plane obtained by inclining the {10-15} plane at any angle of greater than 0° and 0.5° or less.

14. The group III nitride semiconductor substrate according to claim 13, wherein the growth surface is a part of a surface of the group III nitride semiconductor layer, the sapphire substrate is positioned on a surface side opposite to the growth surface and that is integral with the group III nitride semiconductor layer.

* * * * *